United States Patent [19]

Teruhiko et al.

[11] Patent Number: 5,817,957
[45] Date of Patent: Oct. 6, 1998

[54] ELECTRONIC PARTS LOADING DEVICE

[75] Inventors: Fujioka Teruhiko; Okazaki Tadao; Maebara Yoshikazu, all of Hamamatsu, Japan

[73] Assignee: Samsung Aerospace Industries, Ltd., Kyeongsangnam-do, Rep. of Korea

[21] Appl. No.: 788,495

[22] Filed: Jan. 28, 1997

[30] Foreign Application Priority Data

Jan. 29, 1996 [JP] Japan .................................... 8-012603
Jan. 29, 1996 [JP] Japan .................................... 8-012604

[51] Int. Cl.$^6$ .................................................. G01R 31/26
[52] U.S. Cl. ................................................ 73/865; 29/829
[58] Field of Search ........................... 73/865.8; 29/829, 29/832, 833; 348/86, 87

[56] References Cited

U.S. PATENT DOCUMENTS 5,568,264  10/1996  Nakatsuka et al. .
5,661,408  8/1997  Kamieniecki et al. ................. 324/752
5,667,129  9/1997  Morita et al. .

*Primary Examiner*—Robert Raevis
*Attorney, Agent, or Firm*—Finnegan, Henderson, Farabow, Garrett & Dunner, L.L.P.

[57] ABSTRACT

An electronic parts loading device includes a head unit on which an operating element, such as a loading mechanism for loading electronic parts on a printed circuit board or an adhesive spread mechanism for spreading adhesive on the printed circuit board where the electronic parts are to be mounted, is mounted. The electronic parts loading device also includes a driving element for moving the operating element toward or away from the printed circuit board, a measuring element, mounted on the head unit, for measuring a distance from the head unit to a loading location on the printed circuit board, and a control element for optimally controlling the movement of the operating element in response to data measured by the measuring element whenever the operating element performs a loading or spreading application.

10 Claims, 21 Drawing Sheets

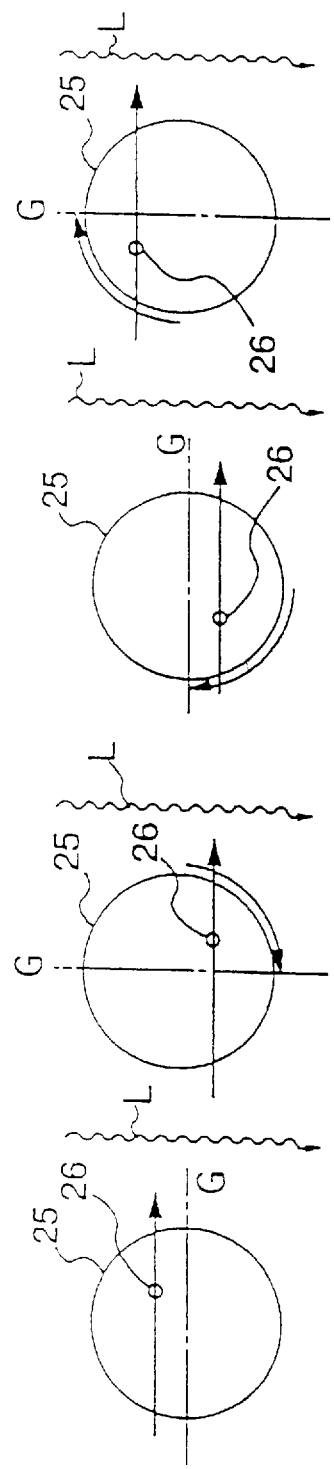
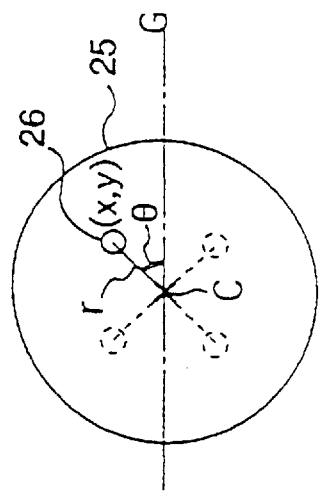
FIG. 19A  FIG. 19B  FIG. 19C  FIG. 19D
FIG. 19E

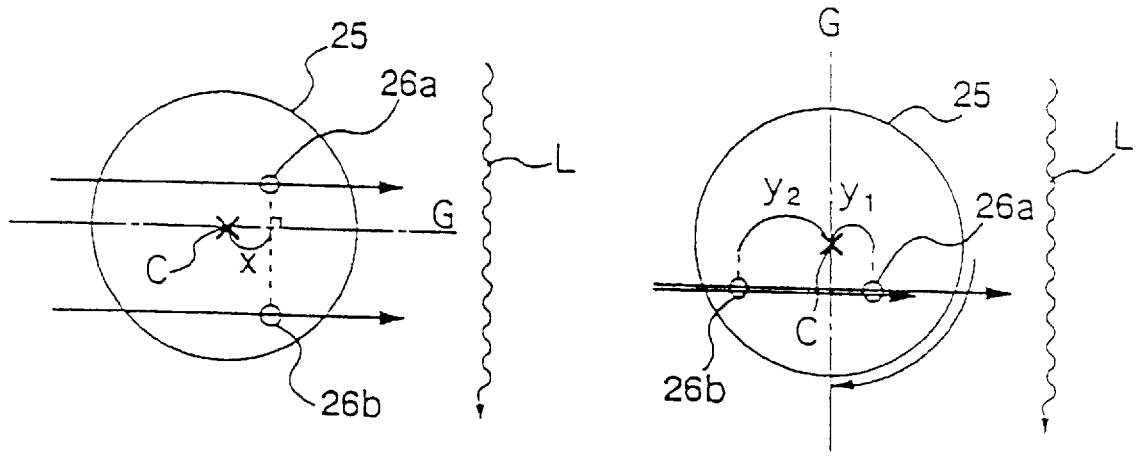
FIG. 20A
FIG. 20B
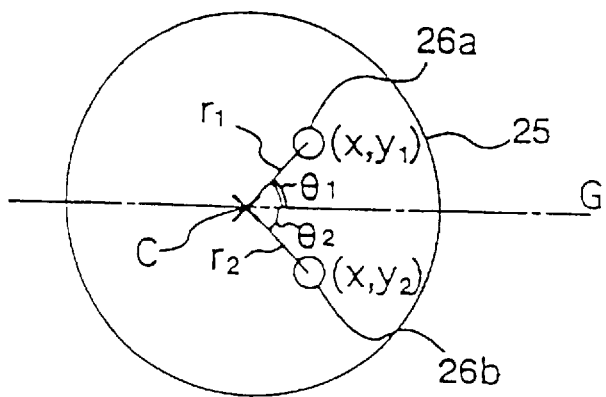
FIG. 20C

ELECTRONIC PARTS LOADING DEVICE

BACKGROUND OF THE INVENTION (1) Field of the Invention

The present invention relates to an electronic parts mounting device and, more particularly, to an electronic parts loading device for mounting electronic parts such as semiconductors on a printed circuit board (PCB).

(2) Description of the Prior Art

Generally, an electronic parts loading device is used to mechanically mount semiconductors such as integrated circuits (ICs) and large scale integration (LSI), diodes, condensers, resistors, etc. to a PCB.

A loading element for loading electronic parts on a printed circuit board, and a spreading element for applying an adhesive before loading onto the PCB are mounted to the electronic parts loading device.

The electronic parts loading device includes a guide rail for guiding the PCB to a fixed location, and a parts stage for supporting a plurality of electronic parts to be loaded on the printed circuit board.

The loading element and spreading element, both comprising a process element, are mounted to a head unit above the guide rail which moves horizontally along X and Y axes.

The process element moves to a loading position and a spreading position (hereinafter referred to as a process position) according to the movement of the loading element. Here, after the process element raises and moves to the process position, it then descends downward toward the PCB.

The PCB, carried in and positioned at a fixed location, often becomes warped and is seldom positioned evenly (i.e., where a distance between the PCB and the head unit is equal over the entire surface of the printed circuit board).

As a result of this frequent unequal distance between the PCB and head unit, the process element descends to a predetermined position without taking into account these discrepancies in distance. This often leads to the process element descending excessively or insufficiently with relation to the PCB.

If the loading element insufficiently descends, the loading element either incorrectly loads the electronic parts or is unable to load the parts to the PCB such that the loading element returns still engaging the electronic part. Also, a lead is not properly settled, or during reflow insufficient movement/loading develops.

If the loading element excessively descends, especially during high-speed loading, as load pressure is generated, the electronic parts can become damaged or pushed to the side such that the loading position of the electronic parts is not securely fixed.

If the spreading element insufficiently descends, the application of the adhesive material may not occur, the application area may not be adequately large, or the application state may not be firm.

Finally, if the spreading element excessively descends, especially when high-speed spreading for ceramic circuit boards etc., the PCB becomes damaged, noise is created, a deficient amount of adhesive material is applied, or the adhesive material is unevenly applied. In all of the above cases, the drawback of an insecure application state results.

To solve the problems of the process element insufficiently and excessively descending, an escape device is added to a loading bit, formed on an end of the loading element, to reduce the incorrect descending of the same, and by the use of a backup pin, the evenness of the PCB is maximized. Also, an adhesion needle and a stopper, which can move the entire up and down distance, are mounted to the spreading element. As a lower end of the stopper makes contact close to adhesive points on the PCB, the degree to which the stopper descends must be set.

As in the above, if an escape device is mounted to the loading element, because it is adhered to a moving part side, careful consideration is required to maintain accuracy, and when moving at high speeds, the added weight from the escape device on the loading element causes shocks.

Also, if a backup pin is used, it is difficult to make the PCB perfectly even because there are individual differences between each PCB. And because a separate suction device is needed to prevent warping of the PCB, the overall structure of the loading device becomes complicated.

Further, if a stopper is mounted to the spreading element, as the adhesion needle is generally connected with a syringe, and even if the escape device is mounted to a drive element for driving the spreading element, the weight of the moving part is greatly increased so as to hinder the speed of the loading device. A drawback results such that the head unit must be rotated to enable a bottom end of the stopper to adhere to points of adhesion and to the loading parts.

With regard to the operation of the process element on the PCB, the process element is raised and moved to the process location, both loading and application locations, by the head unit, and after the process location is reached the process element is advanced downward toward the PCB. An end of the needle is placed at the application location in the spreading element and wetted with application material. Further, according to the degree to which electronic parts are pressed to the adhesive material, reflow solder is realized.

Because electronic parts must be precisely mounted on the PCB, the adhesive material must also be precisely placed. Accordingly, a center of the needle cannot be inaccurately placed because this will result in the imprecise placing of the adhesive material.

Here, for reasons of efficiency and ease, recharging after using the electrically charged adhesive material is generally realized by exchanging the entire syringe. As the syringe and needle are integrated as a single piece, the position of the end of the needle must be re-adjusted every time the syringe is exchanged. The re-adjusting process is further complicated due to the fact that there are a variety of syringe and needle sizes. In addition, when two needles (i.e., twin needles) are used for the application of the adhesive material in two places simultaneously, the positioning of the needles becomes much more arduous.

To solve this problem, an attachment is used for maintaining a center location of the needle even if there are changes in the size of the needle when exchanging the syringe.

However, the structure of the loading device is complicated when using an attachment because changes must be made to allow the exchanging of the attachment. As a result, the overall cost of the loading device is increased and the process is made difficult as the attachment must be changed if the size of the needle is different.

SUMMARY OF THE INVENTION

The present invention addresses the above problems.

It is an object of the present invention to provide an electronic parts loading device which precisely controls a descending degree of a process element, such as a loading element and spreading element, on a printed circuit board (PCB).

It is another object of the present invention to provide an electronic parts loading device which, without the use of location maintaining element as in the prior art, can precisely control a location of a process rod, can be mounted to the loading element for mounting electronic parts to the PCB and to the spreading element for spreading an adhesive material on the PCB.

To achieve the above objects, the present invention provides an electronic parts loading device comprising a head unit on which a working mechanism, such as a loading mechanism for loading electronic parts on a printed circuit board or an adhesive spread mechanism for spreading adhesive on a place of the printed circuit board where the electronic parts are to be mounted, is mounted; a driving means for moving the working mechanism toward or away from the printed circuit board; measuring means, mounted on the head unit for measuring a distance from the head unit to a loading place of the printed circuit board; and control means for optimally controlling the movement of the working mechanism in response to data measured by the measuring means whenever the working mechanism performs a task.

Further, a head unit on which a working mechanism, such as a loading mechanism for loading electronic parts on a printed circuit board or an adhesive spread mechanism for spreading adhesive on a place of the printed circuit board where the electronic parts are to be mounted, is mounted; driving means for moving the working mechanism toward or away from the printed circuit board; measuring means, mounted on the head unit, for measuring a distance from the head unit to a loading place of the printed circuit board; and control means for, before the working mechanism, measuring data of several places of the circuit printed board according to the measuring means, and determining a curvature state of the printed circuit board in response to the measured data, and when the working mechanism performs a certain task, for calculating a distance of a part loading position from the determined curvature state and optimizing a position of the working mechanism.

The measuring means is designed such that it can measure a distance by using ultrasonic or optical means without contacting the printed circuit board.

The measuring means comprises a point needle mounted on a drive part of the head unit to measure the distance by contacting the printed circuit board.

An electronic part mounting device, comprising a head unit on which a working mechanism, such as a loading mechanism for loading electronic parts on a printed circuit board or an adhesive spread mechanism for spreading adhesive on a place of the printed circuit board where the electronic parts are to be mounted, is mounted; driving means for moving the working mechanism toward or away from the printed circuit board; calculating means for calculating a central position with respect to a moving direction of each working bar mounted on the working mechanism when the working mechanism horizontally moves in a state where the working mechanism rotates around a central axis by 90 degrees, and for calculating phase data and an eccentric amount of the bar with respect to the central axis of the working mechanism in response to the calculated data; and control means for controlling an operation of the drive means on the basis of the data from the calculating means such that an end of the working bar can be positioned on a working position during a task.

The working mechanism, rotatable about the central axis by rotating means, comprises two working bars, an initial movement of the working mechanism with respect to the calculating means being performed in a direction vertical to a line connecting the two working bars to each other.

If the central axis of the working mechanism is already known, the eccentric amount and the phase are calculated by the central axis of the working mechanism and two central positions of the working bars with respect to a relative motion thereof; and if the central axis of the working mechanism is not known, the eccentric amount of the phase are calculated by four central positions of the working bars with respect to a relative motion thereof and a central axis defined by the four central positions.

The working mechanism rotatable about the central axis by rotating means comprises two working bars, an initial movement of the working mechanism with respect to the calculating means being performed in a direction vertical to a line connecting the two working bars to each other.

The electronic part mounting device, comprising a head unit on which a working mechanism, such as a loading mechanism for loading electronic parts on a printed circuit board or an adhesive spread mechanism for spreading adhesive on a place of the printed circuit board where the electronic parts are to be mounted, is mounted; driving means for moving the working mechanism toward or away from the printed circuit board; calculating means for calculating a central position with respect to a moving direction of each working bar mounted on the working mechanism when the working mechanism horizontally moves in a state where the working mechanism rotates around a central axis by 90 degrees, calculating an end of the working bar by moving the working mechanism upward, and calculating phase data and an eccentric amount of the bar with respect to the central axis of the working mechanism in response to the calculated data; and control means for controlling an operation of the drive means on the basis of the data from the calculating means such that an end of the working bar can be positioned on a working position during a task.

The working mechanism, rotatable about the central axis by rotating means, comprises two working bars, an initial movement of the working mechanism with respect to the calculating means being performed in a direction vertical to a line connecting the two working bars to each other.

If the central axis of the working mechanism is already known, the eccentric amount and the phase are calculated by the central axis of the working mechanism and two central positions of the working bars with respect to a relative motion thereof; and if the central axis of the working mechanism is not known, the eccentric amount of the phase are calculated by four central positions of the working bars with respect to a relative motion thereof and a central axis defined by the four central positions.

The working mechanism rotatable about the central axis by rotating means comprises two working bars, an initial movement of the working mechanism with respect to the calculating means being performed in a direction vertical to a line connecting the two working bars to each other.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIG. 19 is a diagram illustrating position data calculation mechanism of the position calculation portion in the case of an unknown center axis of the spreading portion according to the third embodiment of the present invention, (A)–(D) representing the needle center detecting with respect to the moving direction, (E) representing an eccentric amount and phase to the position data;

FIG. 20 is a diagram illustrating position data calculation mechanism of the position calculation portion in the case when the spreading portion has twin needles according to the third embodiment of the present invention, (A), (B) representing the needle center detecting with respect to the moving direction, (C) representing an eccentric amount and phase to the position data.

DETAILED DESCRIPTION OF THE PREFERRED EMBODIMENTS

Preferred embodiments of the present invention will now be described in detail with reference to the accompanying drawings.

Figure 1:
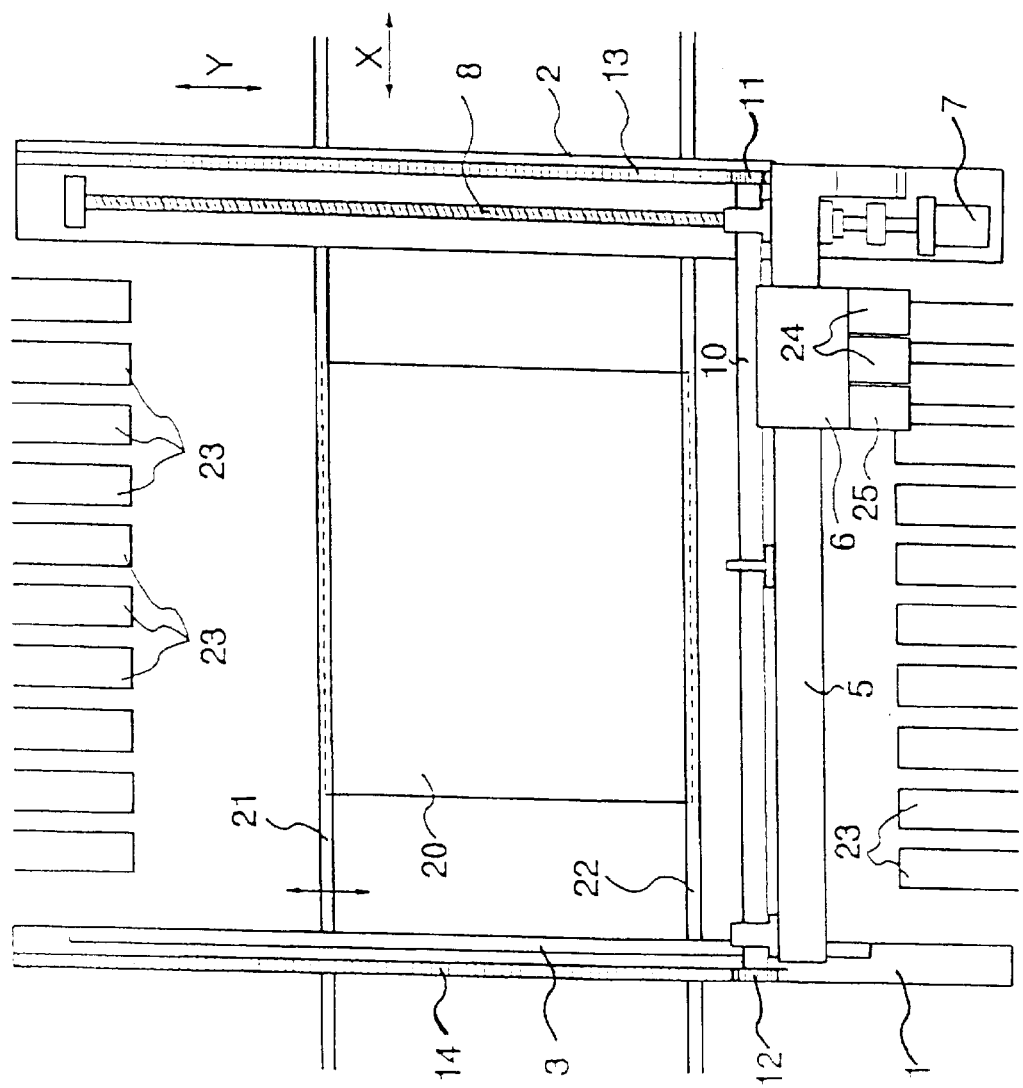
FIG. 1 is a plan view of an electronic parts loading device according to a first embodiment of the present invention.
Figure 2:
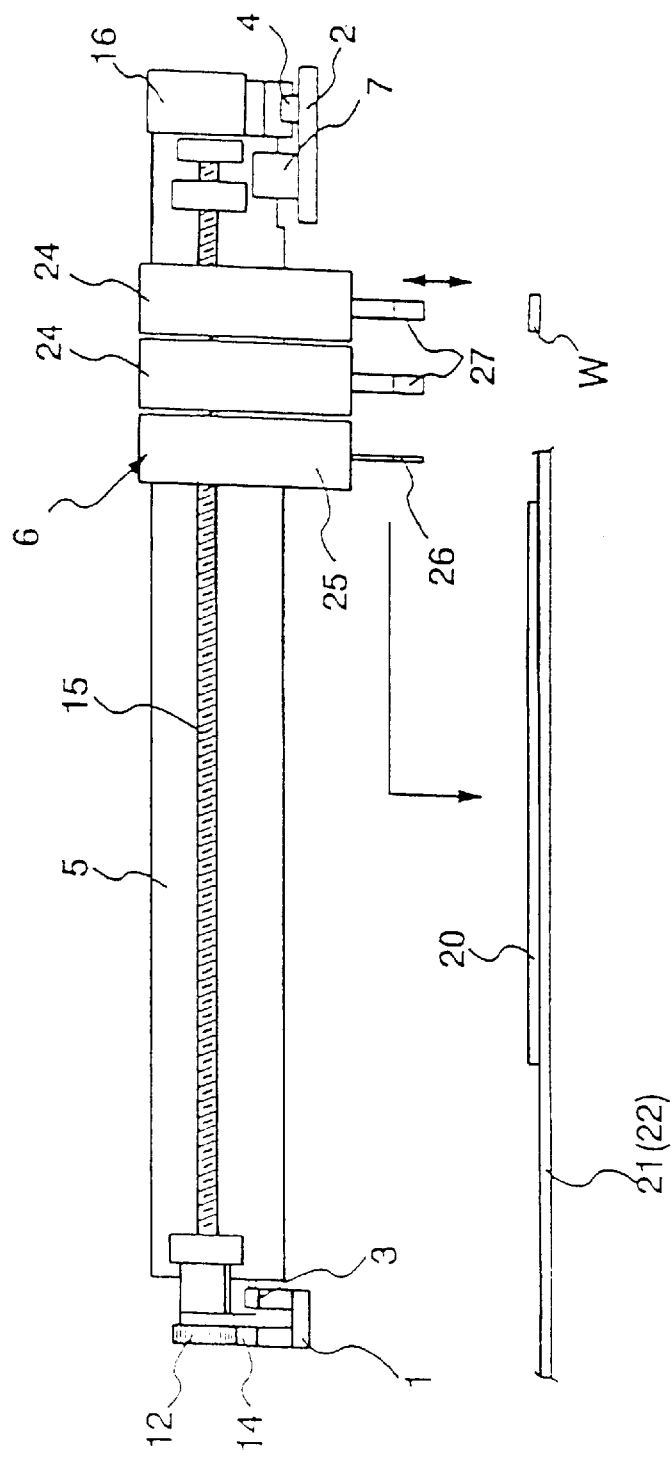
FIG. 2 is a front view of the electronic parts loading device according to the first embodiment of the present invention.

Referring first to FIGS. 1 and 2, an electronic parts loading device according to a first embodiment of the present invention includes two horizontal support members 1 and 2 disposed parallel to each other, and guide rails 3 and 4 formed on the horizontal support members 1 and 2, respectively.

A crossbar 5 is extendedly formed extending perpendicular to the horizontal support members 1 and 2. Guide rails 3 and 4 are mounted on both sides of the crossbar 5 such that the latter is able to freely move along a Y axis along the guide rails 3 and 4.

A head unit 6 is slidably mounted to the crossbar 5, the sliding direction being along the direction of extension of the crossbar (i.e. along an X axis).

To move the crossbar 5 along the Y axis, a ball screw 8, driven by a motor 7, is rotatably mounted to the horizontal support member 2. The ball screw 8 is attached to one side of the crossbar 5, the rotation of the ball screw 8 exerting pulling and pushing forces on the crossbar 5 along the Y axis.

A shaft 10 running parallel with the crossbar is mounted to thereon. Pinion gears 11 and 12 are disposed on both ends of the shaft 10, and rack gears 13 and 14 are connected respectively to the horizontal support members 1 and 2.

As a result, if the ball screw 8 is driven by the drive motor 7, the crossbar 5 moves along the Y axis, as the pinion gears 11 and 12 rolling along the rack gears 13 and 14. Here, the crossbar 5 moves along the Y axis while maintaining a constant perpendicular angle with the horizontal support members 1 and 2.

The movement of the head unit 6 along the X axis is realized through a ball screw 15 (FIG. 2) which is rotatably mounted to the crossbar 5 and coupled to the head unit 6.

The ball screw 15 is driven by a pulley mounted to a main shaft of a drive motor 16 and a timing belt passing over the pulley and engaged with the ball screw 15.

Guide members 21 and 22 are mounted under the horizontal support members 1 and 2 such that the guide members 21 and 22 extend past the horizontal support members 1 and 2 perpendicular to the same. A printed circuit board (PCB) 20 is guided on the guide members 21 and 22 to be transported along the X axis. The guide member 21 is able to move in the Y direction according to the different sizes of PCBs 20.

A plurality of parts stages 23 are formed on both sides of a conveyor formed by the guide members 21 and 22. Mounted on the head unit 6 are a plurality of loading heads 24 for loading electronic parts W on the PCB 20, and a spreading portion 25, for applying cream solder or adhesive material on parts loading positions before the electronic parts are loaded.

As shown in FIG. 2, the spreading portion 25 includes a needle 26 for applying cream solder, and the loading heads 24 include suction bits 27 (suction nozzles) which are able to move up and down.

The needle 26 and suction bits 27 are able to move along the X and Y axes through their connection with the head unit 6.

As a result, when loading electronic parts W to a predetermined position on the PCB 20, the spreading portion 25 is first moved to a loading position, in a state where the needle 26 is raised, then the spreading portion 25 is lowered such that it is able to apply cream solder at a predetermined position.

Next, electronic parts W are picked up from parts stages 23 and loaded on predetermined areas of the PCB 20. When picking up the electronic parts W, the suction bits 27 are lowered on parts stages 23 and the electronic parts W are picked up by the suction force of the suction bits 27. The suction bits 27 are then raised and moved to where cream solder has been applied on the PCB 20. In this way, the electronic parts W are able to be securely fixed to predetermined areas on the PCB 20.

Figure 3:
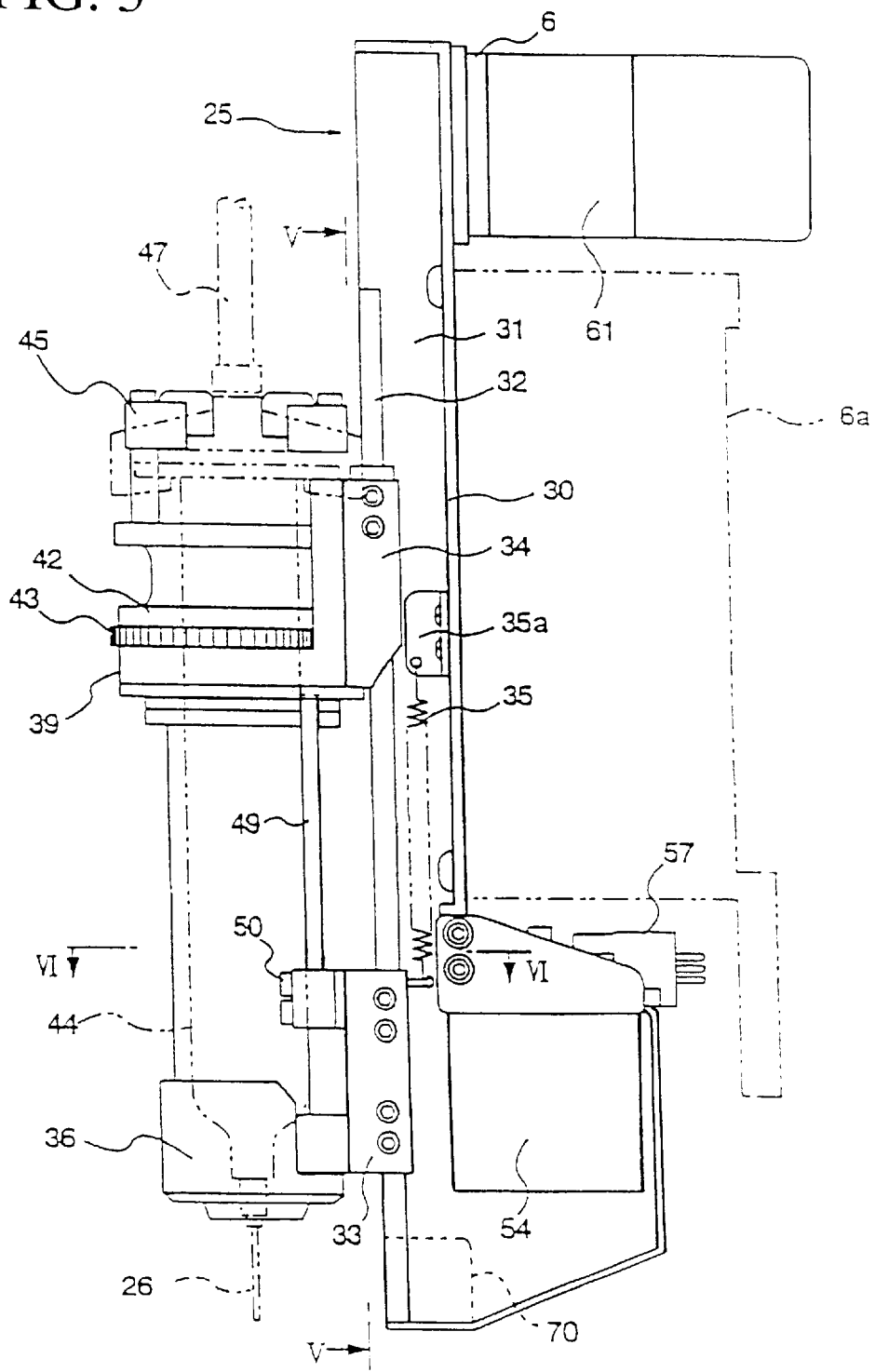
FIG. 3 is an enlarged side view of a spreading device shown in FIGS. 1 and 2.
Figure 6:
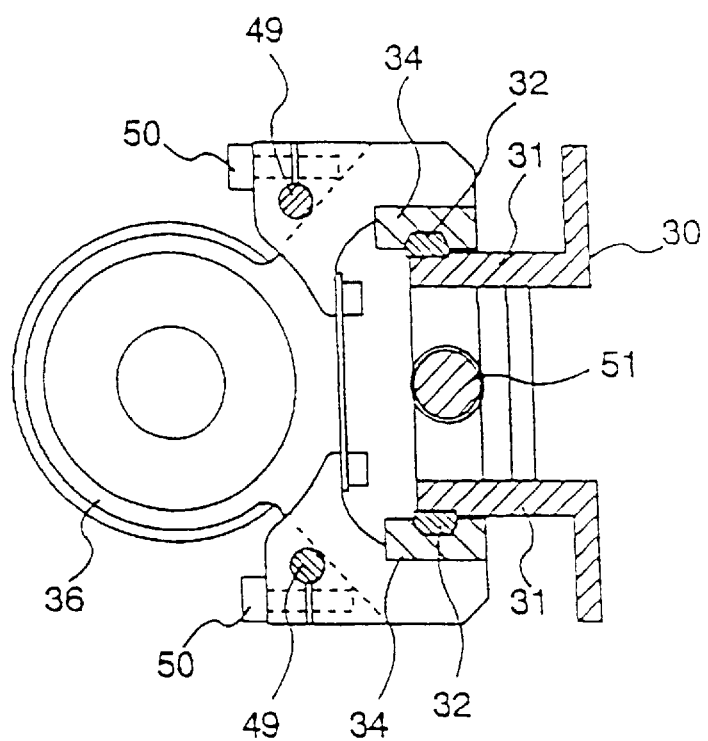
FIG. 6 is a cross sectional view taken along line VI—VI of FIG. 3.

Referring to FIG. 3, a spreading device of FIGS. 1 and 2 is shown enlarged. As shown in the drawing, a support 30 is fixed to a unit body 6a, the unit body 6a being slidably mounted to the crossbar 5. The support 30, as shown in FIG. 6, has two ribs 31 extendably formed in the upper and lower directions thereof.

An outside of each rib 31 is fixed on guide rails 32, and a lower slider 33 and an upper slider 34 are mounted to the guide rails 32 such that the sliders 33 and 34 are able to ascend and descend along the guide rails 32.

A bracket 35a is fixed to the support 30, and a pressure coil spring 35 is mounted between the lower slider 33 and bracket 35a. The pressure coil spring 35 exerts elastic force onto the lower slider 33 in an upward direction.

Figure 4:
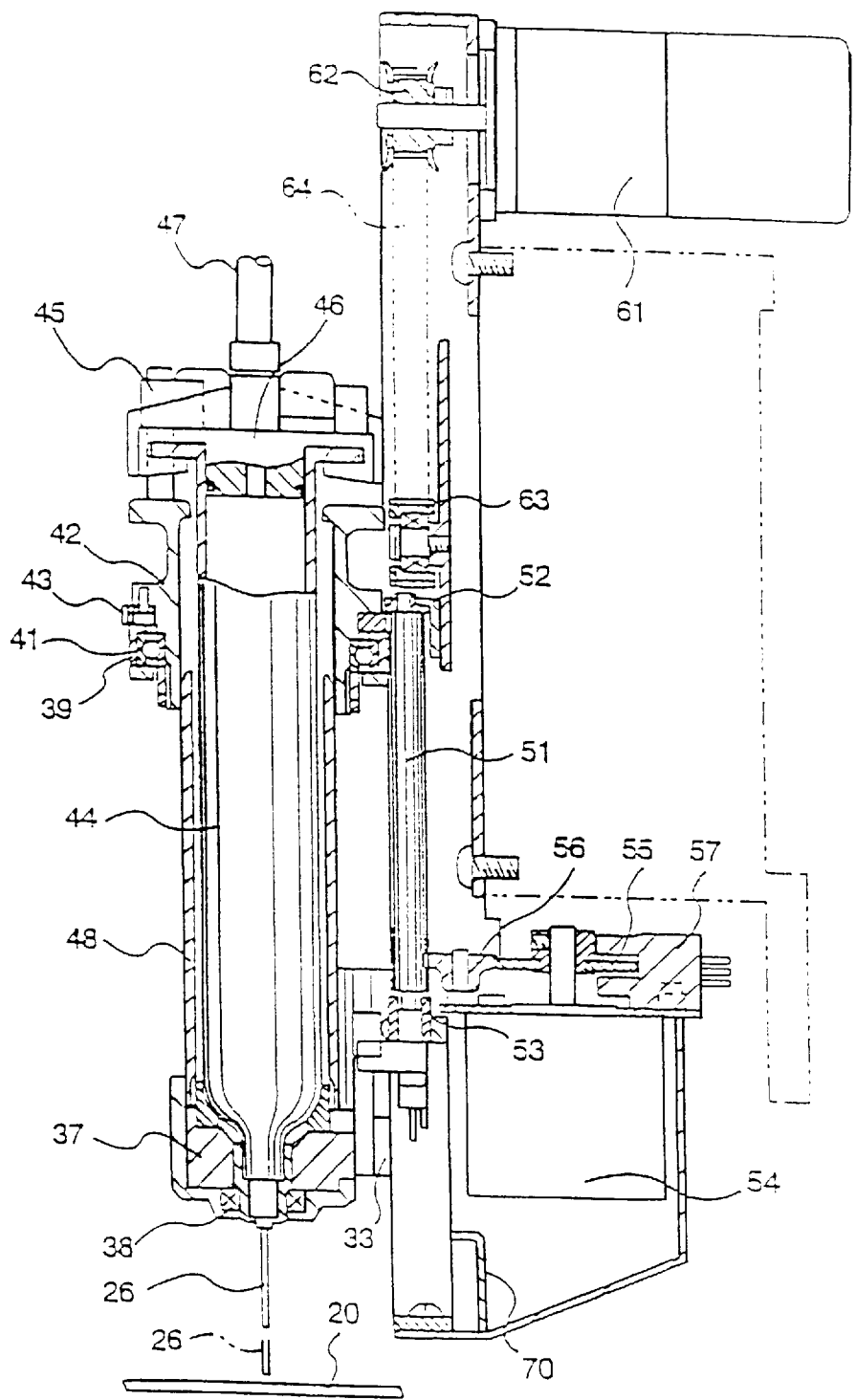
FIG. 4 is a cross sectional view of the spreading device shown in FIGS. 1 and 2.

A lower holder 36 is fixed to the lower slider 33, and, as shown in FIG. 4, a support block 37 and a radial bearing 38 are mounted to the lower holder 36.

Referring back to FIG. 3, a retainer 39 having a ring-shaped portion is fixed to the upper slider 34, and, as shown in FIG. 4, a circular upper holder 42 is rotatably fixed to an inside of a radial bearing 41 mounted on an inside of a retainer 39. A ring-shaped driven gear 43 is fixed to the upper holder 42.

A needle 26, which discharges cream solder, is mounted to a lower end of a solder container or syringe 44, the lower end having a circumference smaller than that of the rest of the syringe 44. The syringe 44 is supported on upper and lower ends by the upper and lower holders 42 and 36.

A clamp member 45 is mounted to the upper holder 42, and a pressure cap 46 is connected to the syringe 44 by the upper holder 42 such that it is pressure meshed with an opening portion on an upper end of the syringe 44.

As a result, the syringe 44 is supported by the upper holder 42 as it is raised, and by the lower holder 36 as it is lowered. As the syringe 44 is lowered, the lower holder 36 receives tension in the upward direction by the elasticity of the pressure coil spring 35.

A pipe 47 for supplying pressurized air is connected to the pressure cap 46. Pressurized air pulses are supplied to an inside of the syringe through the pipe 47, and, as a result, a predetermined amount of solder or adhesive material can be discharged through the needle 26.

Because the syringe 44 is supported by separate upper and lower holders 42 and 38, syringes of varying lengths can be used. As long as the syringe used is smaller in diameter than the cylindrical cover 48 fixed to the lower holder 36, it can be used in the loading device.

As shown in FIG. 6, tie rods 49, protruding in a downward direction, are mounted to the retainer 39, inside of which the upper holder 42 is disposed. The tie rod 49 extends down to the lower slider 33 where it is connected to the lower slider 33 through a screw member 50. The screw member 50 can be loosened and readjusted on the tie rod 49 to vary the distance between the upper and lower holders 42 and 36.

Referring to FIG. 4, to rotate the syringe 44, a drive gear shaft 51, extending vertically, is rotatably mounted on the support 30 by upper and lower bearings 52, 53. The drive gear shaft 51 is gear-shaped over an entire outside surface thereon, and is meshed with the driven gear 43 fixed to the upper holder 42.

An electric motor 54 is mounted to the support 30. A drive gear 55 fixed to a shaft of the electric motor 54 is meshed with a lower portion of the drive gear shaft 51 through the interposition of an idle gear 56.

Accordingly, the upper holder 42 rotates by the operation of the drive gear shaft 51 meshed with the driven gear 43, which, in turn, rotates the syringe 44.

A sensor 57 is fixed to the support 30 to detect a rotating angle of the drive gear 55. As a result, a rotating angle of the syringe is also detected.

An electric motor (upper/lower drive means) 61 is fixed to an upper portion of the support 30 to raise and lower the syringe 44. A pulley 62, fixed to a shaft of the electric motor 61, is connected to a pulley 63, rotatably mounted to the support 30, through a timing belt 64.

Figure 5:
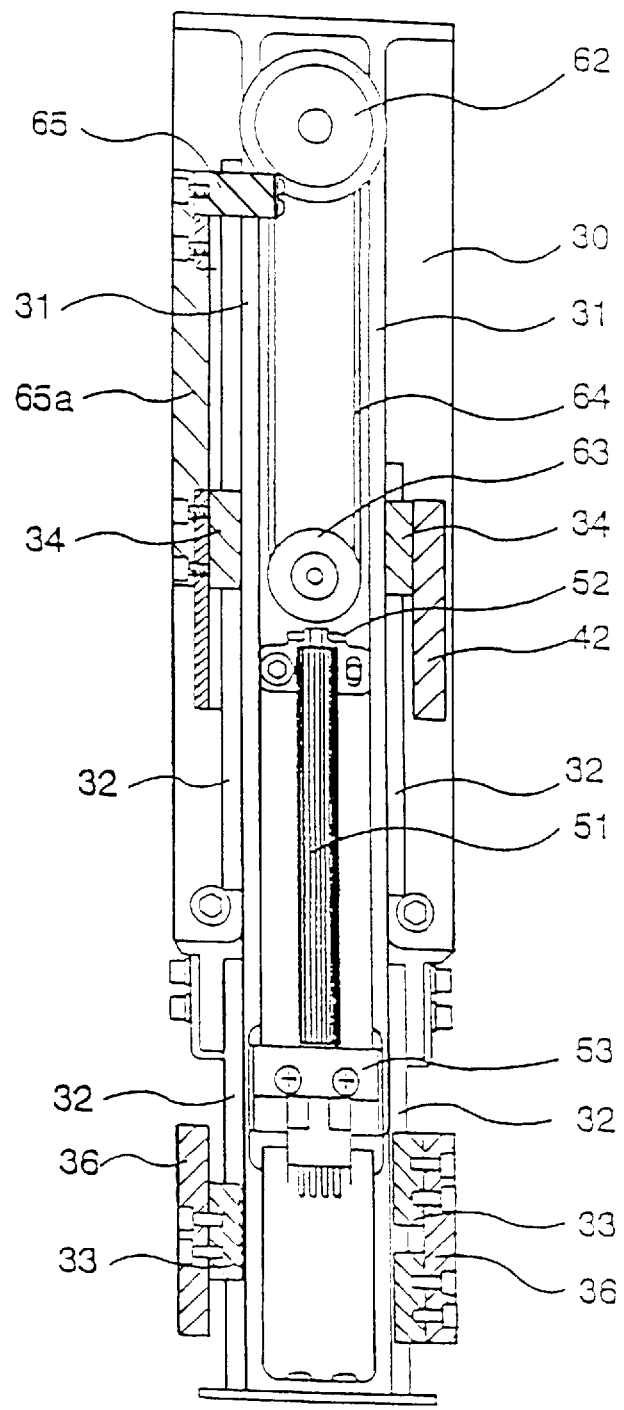
FIG. 5 is a cross sectional view taken along line V—V of FIG. 3.

As shown in FIG. 5, a connecting opening 65 is fixed to the timing belt 64, the connecting portion 65 being connected to the upper holder 42 through a connecting member 65a.

Accordingly, the timing belt 64 is driven by the electric motor 61, and the upper holder 42 ascends and descends through the interposition of the connecting portion 65, thereby raising and lowering the syringe 44.

Also, an electric motor is provided for equally raising and lowering the loading head 24 and spreading portion 25, both mounted on the head unit 6.

A measuring portion (measuring means) 70, for measuring the distance between the head unit 6 and the application position of the PCB 20, is provided in the loading device. The measuring portion 70 performs its measurements without making contact with the PCB 20.

Figure 7:
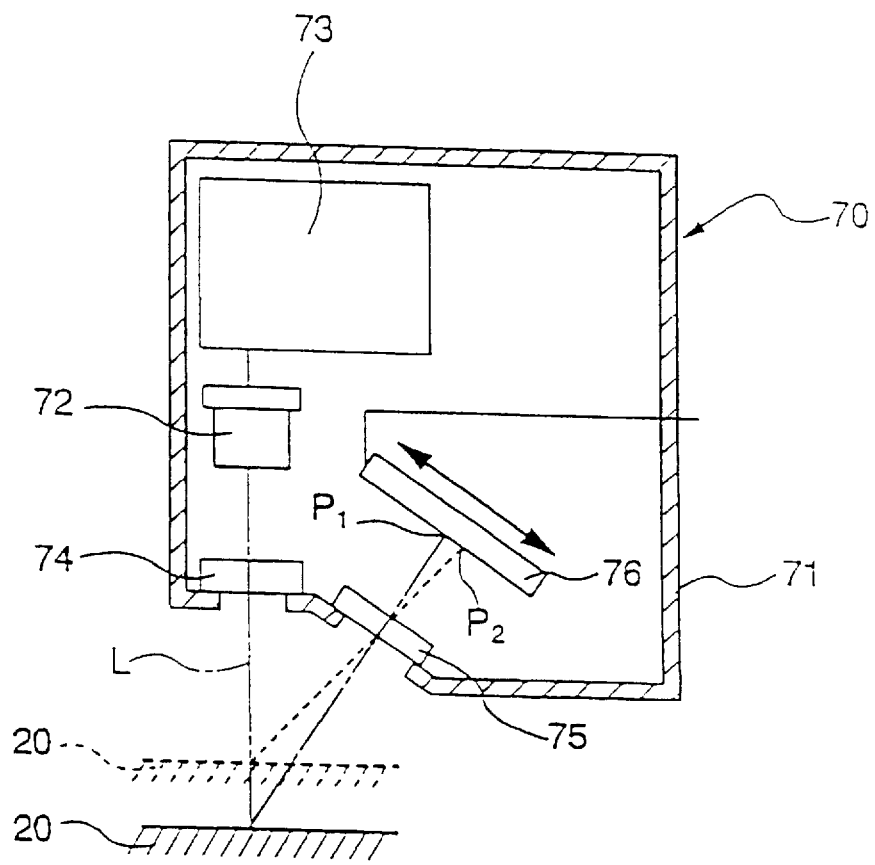
FIG. 7 is a cross sectional view of a measuring portion used in the electronic parts loading device of FIG. 1.

Referring to FIG. 7, there is shown an internal structure of the measuring portion 70. The measuring portion 70 utilizes a laser displacement gauge for performing its measurements. As shown in the drawing, a semiconductor laser 72, which generates visible semiconductor laser light L, is mounted inside a housing 71 of the measuring portion 70.

In the semiconductor laser 72, a drive signal is transmitted from a drive circuit 73, and a laser light L is emitted to a parts loading position through a projecting lens 74.

Also, a light-receiving lens 75 and a light detecting element 76 are mounted in a reflecting path of the laser light L, reflected from the parts loading position, inside the housing 71 of the measuring portion 70.

As a result, the distance between the PCB 20 and head unit 6 can be detected by the light detecting element 76, using the positioning of the reflected laser light L on its surface as a guide. The solid line in the drawing shows the reflection of laser light L to a center of the light detecting element 76, when this distance (between the PCB 20 and head unit 6) is shortened, the laser light L reflects onto an area of the light detecting element 76 slightly off from the center, as shown in the dotted line in the drawing.

Furthermore, when the spreading portion 25 and the loading head 24 are mounted to head unit 6, to which the measuring portion 70 is mounted, the distance between the PCB 20 and loading position can also be measured.

Figure 8:
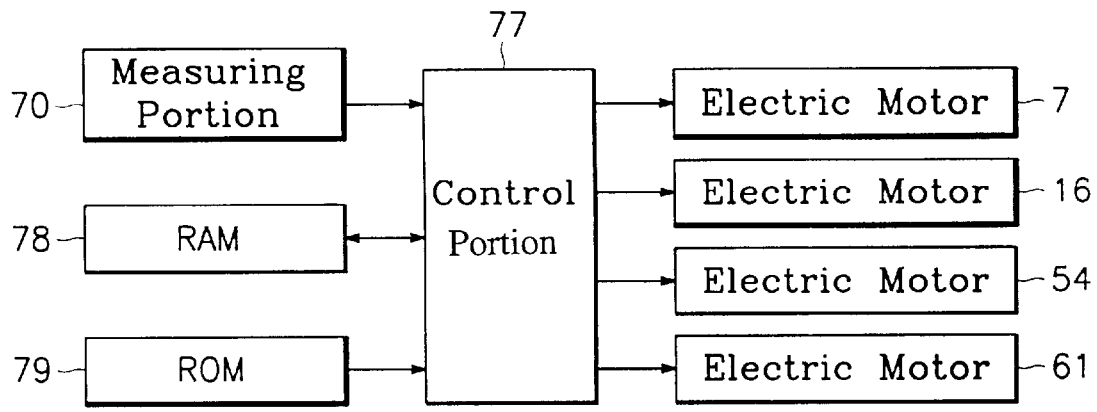
FIG. 8 is a block diagram of a control device of the electronic parts loading device shown in FIG. 1.

A control portion (control means) 77 is mounted to the electronic parts loading device of the present invention. As shown in FIG. 8, the control portion 77 is electronically connected to the measuring portion 70, the electric motors 7 and 16 which respectively move the crossbar 5 and the head unit 6 along the Y axis, electric motors 54 and 61 which respectively raise and lower the spreading portion 25 and loading head 24, a random access memory (RAM) 78, and a read only memory (ROM) 79.

Stored in the RAM 78 and ROM 79 are data points of the loading position and spreading position of the cream solder for the electronic parts W. The electric motors 7, 16, 54, and 61 are operated using this data and data of the measuring portion 70.

That is, the electric motors 7 and 16 are operated by the control portion 77 to move the spreading portion 25 according to the determined spreading position, and if the distance to the spreading position is measured by the measuring portion 70, the descending degree of the needle 26 is compensated to an optimal level, and the electric motor 61 is operated to move the spreading portion 25.

The above control is performed when the spreading portion 25 performs a solder spreading and, also, when the loading head 24 performs a loading operation.

The following is an explanation of the sequence of operations when cream solder, etc. is applied to the PCB 20 by the spreading portion 25.

First, when applying cream solder on a predetermined position of the PCB 20, in a state where the syringe 44 is raised, the crossbar 5 is moved along the Y axis, and, at the same time, the head unit 6 is moved along the X axis.

As a result, if the needle 26 of the spreading portion 25 mounted on the head unit 6 is moved to the spreading position, the electric motor 61 is driven and the syringe 44 is lowered.

Figure 9:
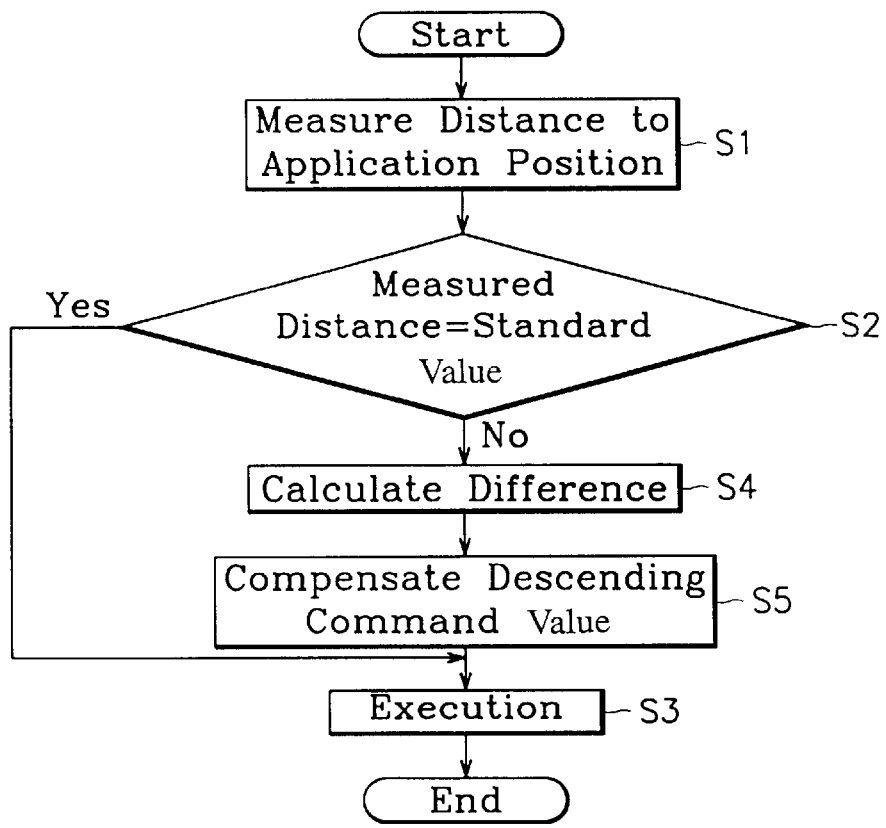
FIG. 9 is a flow chart of a cream solder application process performed by the electronic parts loading device of FIG. 1.

In the above, before the syringe 44 is lowered, as shown in FIG. 9, the distance to the spreading position is measured by the measuring portion 70 (S1).

When the descending maximal value (in this embodiment about 0.1 mm between a limit position of the needle 26 and the spreading position) that is, when a standard value and measurement value are equal, the electric motor 61 is driven according to a descending command value corresponding to the standard value, and the spreading operation is executed (S3).

If the standard value and measured distance are not equal (S2), however, the difference between the two is calculated (S4). The descending command value is then compensated according to this difference (S5).

Next, the electric motor 61 is driven according to the compensated command value to perform descending (S3). As a result, the spreading portion 25 always descends to an optimal level.

The state where the needle 26 is lowered to the descending limit position is shown by the dotted line in FIG. 4.

Further, a syringe 44 with the length as illustrated is supported by the upper and lower holders 42 and 36 in FIGS. 3 and 4. FIGS. 3 and 4 show a state where the syringe 44 is moved upward to a predetermined rising position, while the syringe 44 is returned horizontally.

In contrast to FIGS. 3 and 4, FIG. 5 illustrates a state where the syringe 44 moves downward to a predetermined descending position where the engagement between a tie rod 49 and a lower slider 33 is released and the lower holder 36 is separated from the upper holder 42.

When the syringe 44 moves downward, compressed air in a the form of pulses is provided from a pneumatic source (not shown) in the syringe 44, and cream solder of a fixed small quantity is spread to a surface to be applied.

After finishing the spreading of solder, the syringe 44 driven by the electric motor 61 moves upward to the predetermined rising position. In a case where electronic parts W are loaded on a part to which solder is applied, the loaded head 6 is moved to a temporary stage among part stages 23 illustrated in FIG. 1.

As shown in FIG. 1, the head unit 6 is loaded with two loading heads 24, one of which moves the head unit 6 above a specific part stage 23.

Under the above-described state, the suction bits 27 down so that the suction bits 27 can pick up the electronic parts W supported by the part stage 23. The picked up electronic parts W are fixed on a PCB 20 after positioning the electronic parts W at a solder pre-applied position.

The downward movement of the loading head 24 is controlled, based on descending information calculated from the measurement of the distance to a loading position, in the same manner as shown in the flow chart illustrated in FIG. 9.

That is, a controlling portion 77 performs an identical control for descending regarding the loading head 24 and the spreading portion 25 which are described in a second preferred embodiment to be described hereinafter.

While, descending between the first and the second preferred embodiments are different, and the point of the suction bits 27 descends from the loading head 24 supporting electronic parts W, for example, to a position corresponding to the height of the electronic parts W.

Also, in case of loading on PCB, a loading work is achieved by the suction bits 27 only without operating the spreading portion 25, such that no solder or adhesive material is not used.

In the above description, a syringe 44 having two needles 26 may be loaded, and the shape thereof when the syringe is rotated is designed to be a predetermined one. The position of the two needles 26 is changed by rotating the syringe 44, using electric motor 54.

The rotation of the syringe 44 is performed through a meshed between connection which a driving gear shaft 51 and a driven gear shaft 43. The rotation ratios between the driving gear shaft 51 and the driven gear shaft 43 are identical regardless of the position to be meshed since the gear of the driving gear shaft 51 is formed through its full length. Accordingly, the syringe 44 can be rotated both in an upward and downward position.

An electronic parts loading device in accordance with embodiments of the present invention enables the spreading portion 25 and the loading head 24 to move downward precisely according to the optimum position, since a measuring portion measures the distance from the head unit 6 to a spreading position or a loading position when the operating portion of the spreading portion 25 or the loading head 24 spreads cream solder or mounts electronic parts W, and the movement of the electric motor 61 is controlled by the data measured by the measuring portion 70.

As a result, even though an escape apparatus is loaded on the needle 26 or the suction bits 27, it does not affect accuracy due to the small amount of stroke thereof.

Any damage on PCB 20 due to pushing pressure or breakage during measurement can be prevented by the measuring portion 70 which measures distance in a non-contact manner by using a laser displacement meter.

Figure 10:
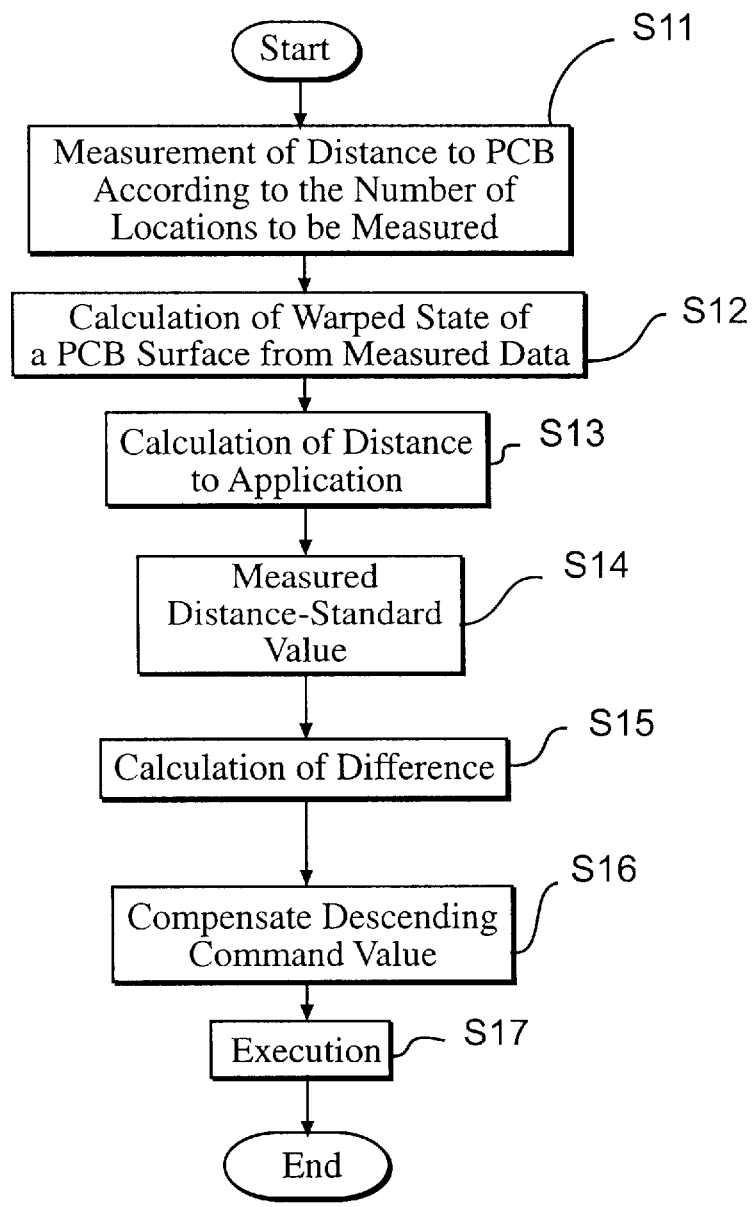
FIG. 10 is a flow chart of a cream solder application process performed by an electronic parts loading device according to a second preferred embodiment of the present invention.

FIG. 10 illustrates a flow chart showing a controlling operation for descending the spreading portion during a cream solder spreading process performed by an electronic parts loading device in accordance with a second preferred embodiment of the present invention.

A description of the mechanical structure of the device in accordance with a second preferred embodiment of the present invention is omitted since it is identical to that in the foregoing embodiment.

As shown in FIG. 10, control of descending in accordance with a second preferred embodiment of the present invention is accomplished before starting spreading work. The distance from the head unit to PCB is measured (S11) and the bending (i.e., curvature) state of the whole surface of PCB from the measured distance is calculated (S12).

When a curved PCB surface is detected, it is necessary to set measuring points in terms of three dimensions, for example detecting five points consisting of four corners and one center of the PCB is preferred. The number of measuring points is not limited to five, but can be set as desired. After calculating the curvature state from the measured data, spreading work begins. Next, a distance from the calculated bending point of the PCB to the spreading position is calculated (S13).

The next step is almost identical to that described in the first preferred embodiment. If the calculated distance is identical to the standard value (S14), the spread portion descends in response to an electric motor being driven according to the descending command value corresponding to the standard value, and spread work is performed (S17).

While, if the calculated distance is not identical to the standard value (S14), the difference between the standard value and the measured distance is calculated (S15). The descending command value is compensated according to the difference between the standard value and the measured distance (S16). The spreading portion descends in response to the electric motor being driven according to the compensated command value, and spread work is performed (S17).

Also, in the case of loading electronic parts, the optimum control of descending is accomplished in that the loading distance is calculated according to the curvature state of the PCB surface.

As shown by the above, a spreading portion or a loading head in the second preferred embodiment of the present invention descends optimally.

Also, since a distance from the bending point of the pre-measured PCB surface to a spreading position (or a loading position) is calculated, time for such work can be reduced, compared to the case of measurement at the time spreading work and the like is performed. This is most clearly seen in the case of multiple points for spreading or loading.

A third preferred embodiment of the present invention will now be described hereinafter.

Figure 11:
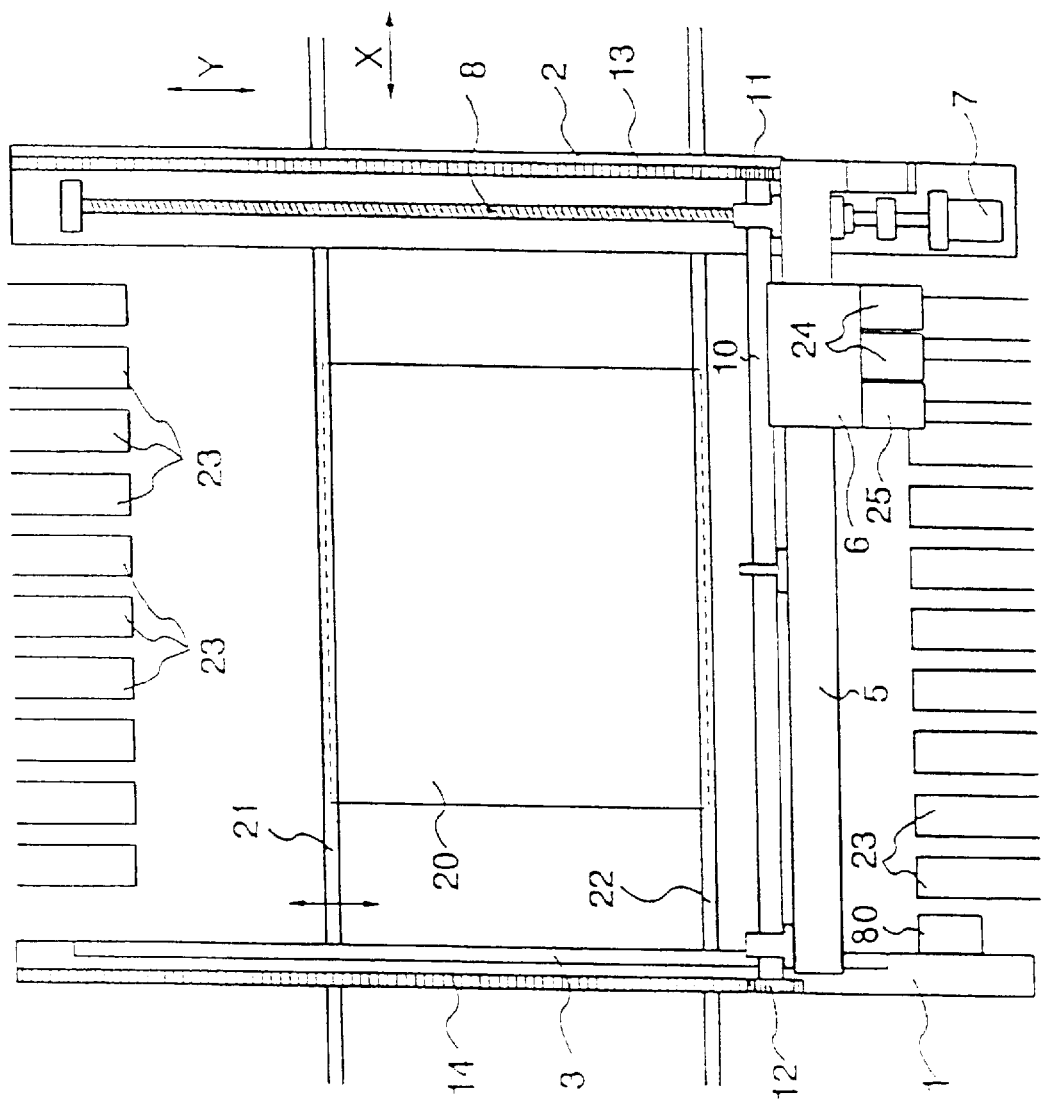
FIG. 11 is a plan view of an electronic parts loading device according to a third embodiment of the present invention.
Figure 12:
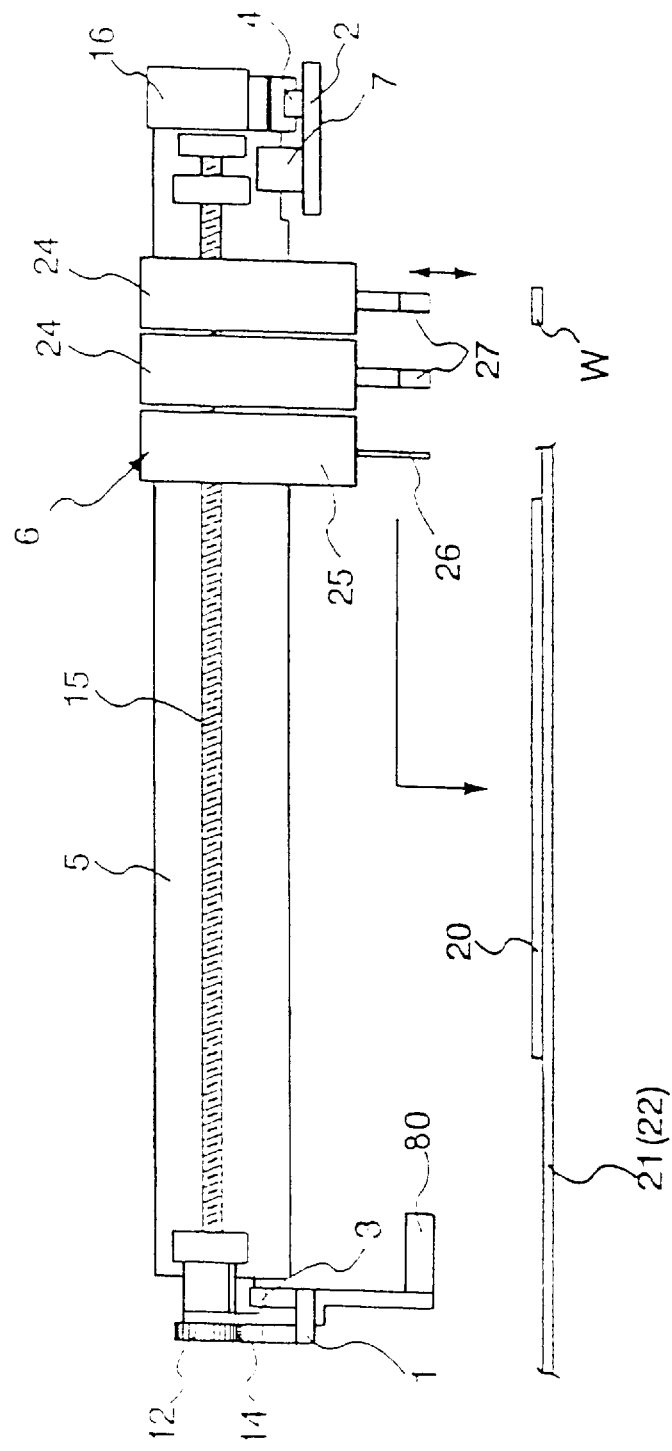
FIG. 12 is a front view of the electronic parts loading device according to the third embodiment of the present invention.

FIG. 11 is a plan view illustrating a schematic structure of an electronic parts loading device in accordance with a third preferred embodiment of the present invention, while FIG. 12 is a front view illustrating a schematic structure of the electronic parts loading device in accordance with the third embodiment of the present invention. Also, FIG. 13 is an enlarged side view of a spreading portion of the electronic parts loading device in accordance with the third preferred embodiment of the present invention.

Figure 13:
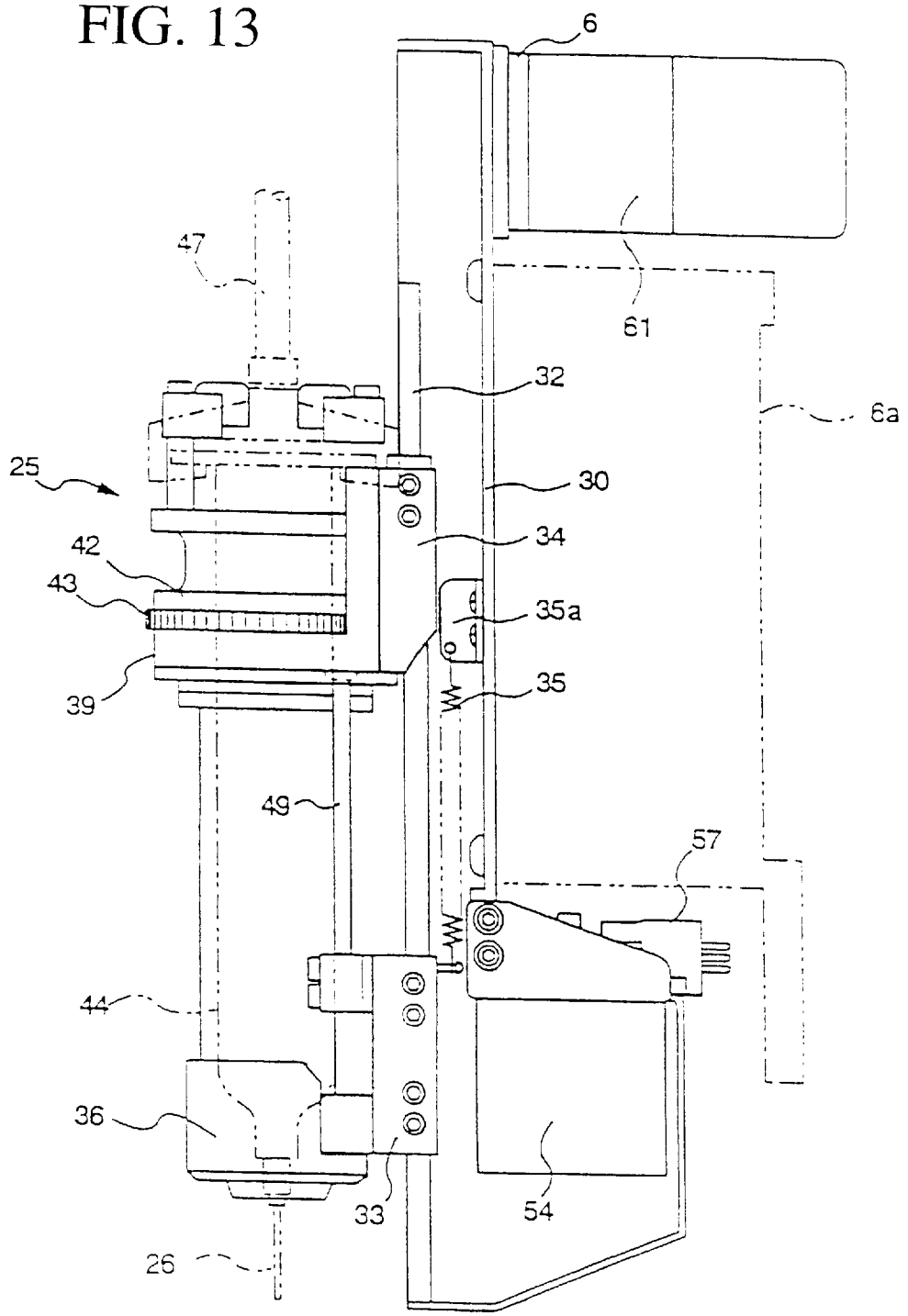
FIG. 13 is an enlarged side view of a spreading device of the electronic parts loading device according to the third embodiment of the present invention.

Since the structures of FIGS. 11, 12 and 13 are almost identical to those of FIGS. 1, 2 and 3, a description of the structures is omitted. The important parts in this embodiment or parts other than those in previous embodiments will only be described hereinafter.

An electric motor 61 is fixed on the point of the support 30 in order to drive the spreading portion 25 upward/downward. A timing belt driven by this electric motor 61 is connected with the upper holder 42 by means of a connecting member (not shown), and the spreading portion 25 is driven upward/downward by the upper holder 42 moving upward/downward by the rotation of the timing belt. Additionally, although it is not shown, an electric motor with the same shape as the above motor is installed in the loading head 24, which drives the loading head 24 upward/downward.

As shown in FIGS. 11 and 12, a position calculating portion 80 is installed around a part stage 23 of horizontally supporting member 1 in one direction.

Figure 14:
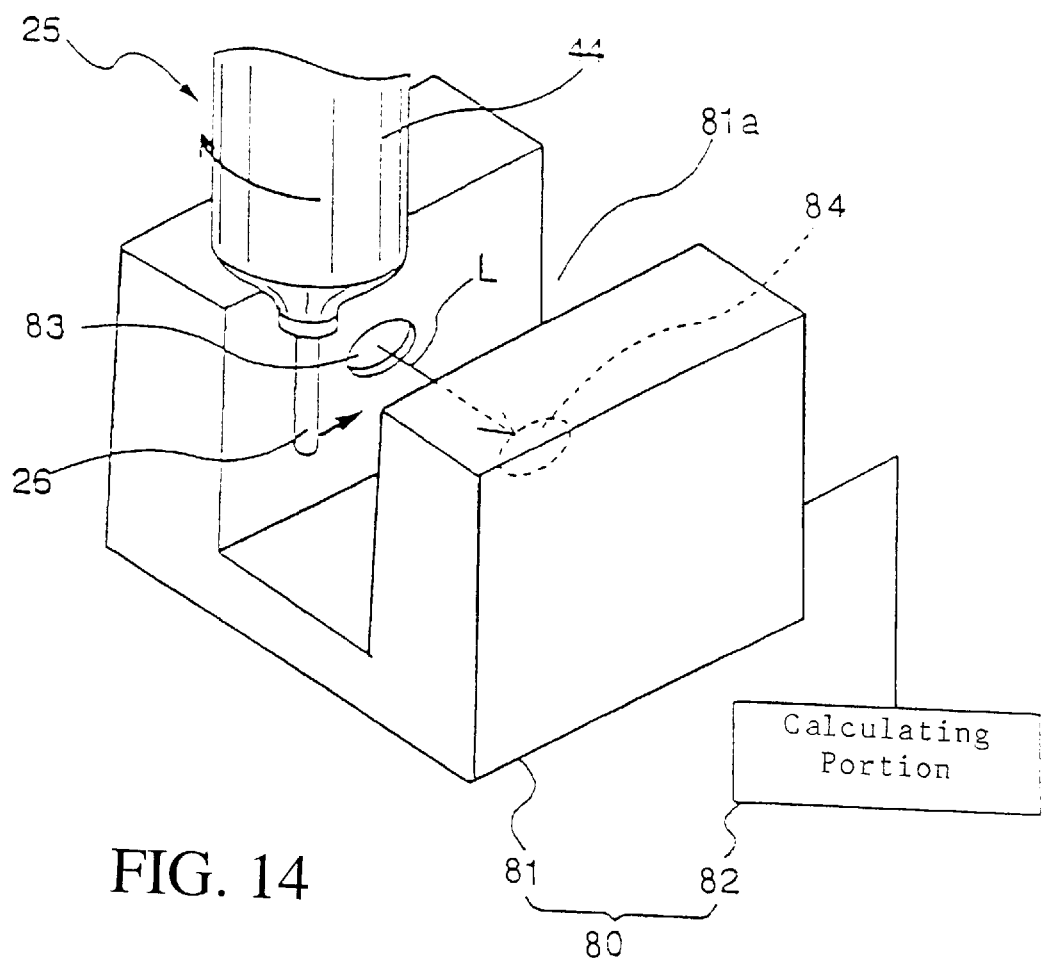
FIG. 14 is a schematic view of a position calculating device of the electronic parts loading device according to the third embodiment of the present invention.

This position calculating portion 80, as detailed illustrated in FIG. 14, consists of a detecting portion 81 detecting from a photoelectric switch, and a calculating portion 82 calculating position data from data detected by the detecting portion 81 and the detecting opening 81a is formed thereon. Beam L is irradiated to the light receiving portion 84 which is located oppositely in an inside wall of the other direction from the light projecting portion 83 which is located in the inside wall of one direction of the detecting opening 18a. Therefore, a center position of the beam L is detected, when this beam is on/off through a needle 26 (or suction bits) passed from the detecting opening 18a.

Figure 15:
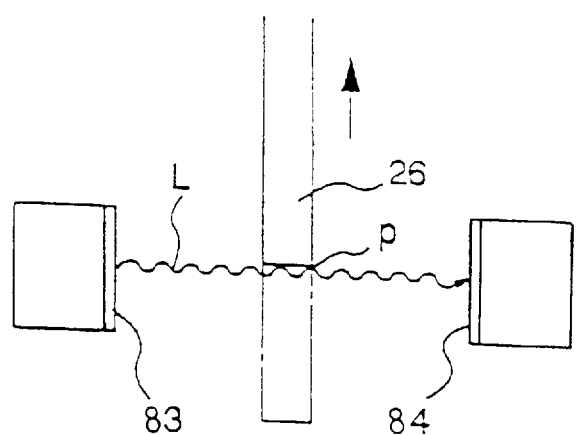
FIG. 15 is a drawing illustrating a position detecting operation for a point of a needle of the position calculating device of the electronic parts loading device according to the third embodiment of the present invention.

As shown in FIG. 15, when a center of the needle 26 is increased in accordance with a center of the beam L, a point of the beam can be detected by opening the closed passage of the beam L.

Regardless of the present position, a position of the position calculation portion 80 can be defined without any limitation.

Although FIGS. 14 and 15 show that the needle 26 is used to calculate position, the suction bits 27 can alternatively be used.

Figure 16:
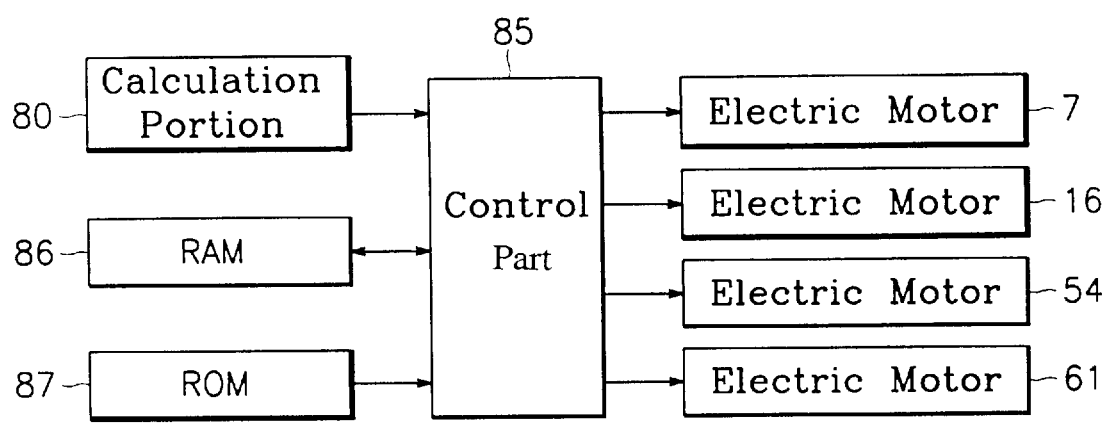
FIG. 16 is a block diagram of a control device of the electronic parts loading device according to the third embodiment of the present invention.

The present invention of an electronic parts loading device is controlled by a control part 85 illustrated in FIG. 16. Namely, there are electrically connected some parts in a control part 85. The control part 85 has a position calculation portion 80 which calculates a position of the needle 26 and the suction bits 27, a RAM (random access memory) 86 and ROM (read only memory) 87 having processor, control, and partial data. In order to control the needle 26 and the suction bits 27 by using the data of the position calculation portion 80, RAM 86 and ROM 87, electric motors 16, 7, 61, and 54 are connected to each other. For the purpose of controlling the needle 26 and suction bits 27, each motor actuates in different direction. The motors 7 and 16 horizontally actuate in the X and Y axis direction, the motor 61 vertically actuates, and the motor 54 rotates around the center axis. A point of the needle 26 and suction bits 27 can be located in a work position with an accuracy by the method as follows.

The following is an explanation in which adhesive material is applied to a fixed position on the PCB 20 by a spreading portion 25.

Detecting position of the needle 26 is realized before the adhesive material is deposited at the fixed position of PCB 20. The detecting position is carried out not only in realizing the work but also in shifting the needle 26 such as exchanged syringe 44. The above detecting procedure operates in accordance with the procedure of FIG. 17.

Namely, when the electric motor 61 ascends, the electric motor 7, 16 makes cross bar 5 shift in the Y direction and head unit 6 shift in the X direction. Finally the spreading portion 25 moves adjacent to the detecting part 81 by the photoelectric switch (S21).

Also, after the spreading portion 25 is, by means of the actuating the electric motor 61, descended to the height of which a point of the needle 26 crosses over the beam L of the photoelectric switch (S22), the spreading portion 25 moves horizontally so that its point crosses over the beam L of the photoelectric switch by making the needle 26 pass through the detecting opening 81a (S23). When the electric motor 7, 16 is a servo motor as shown in FIG. 18, a center position of the needle 26 is calculated from a mutual relation between the on/off of the photoelectric switch and the encoder pulse of electric motor 7, 16 which shifts the spreading portion 25 for the purpose of cutting the needle 26.

Figure 18A:
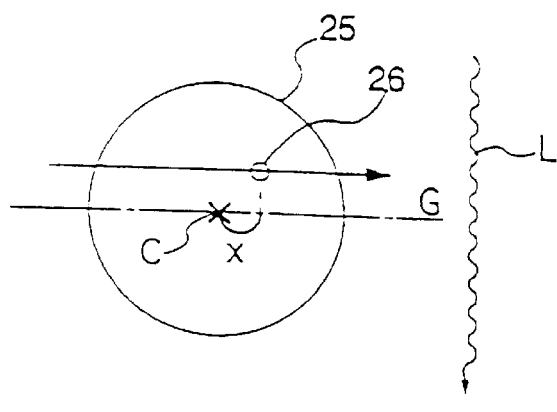
FIG. 18 is a diagram illustrating position data calculation mechanism of the position calculation portion in the case of a known center axis of the spreading portion according to the third embodiment of the present invention, (A), (B) representing the needle center detecting with respect to the moving direction, (C) representing an eccentric amount and phase to the position data.

In FIG. 18 the large circle is the spreading portion 25, X is a center axis of the spreading portion 25, and the small circle is the needle 26.

Suppose that reference line G which is inserted in a shifting direction through the center axis of the spreading portion 25 is regarded as an imaginary axis X. The center position of the needle 26 detected by the above shifting indicates X. In addition, the electric motor 7, 16, which may include the electric motor 54, 61 or a stepping motor or another type of motor can be used, the mutual relation between the on/off of the photoelectric switch and actuation pulse is recognized.

After the above movement, the spreading portion 25 rotates around the center axis 90 degrees by actuating the electric motor 54 (S25). The spreading portion 25 shifts horizontally so that the point of the needle 26 can cross over the beam L of the photoelectric switch (S26). The center position of the needle 26 can be calculated by the above method such as the shifting direction (S27).

Figure 18B:
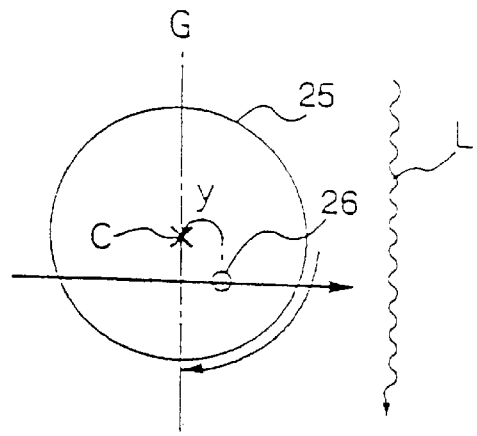
Figure 18C:
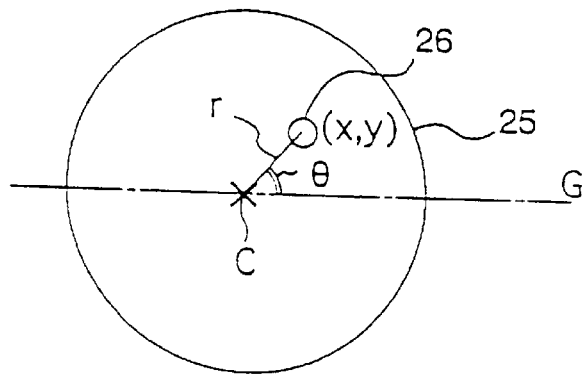
Figure 21:
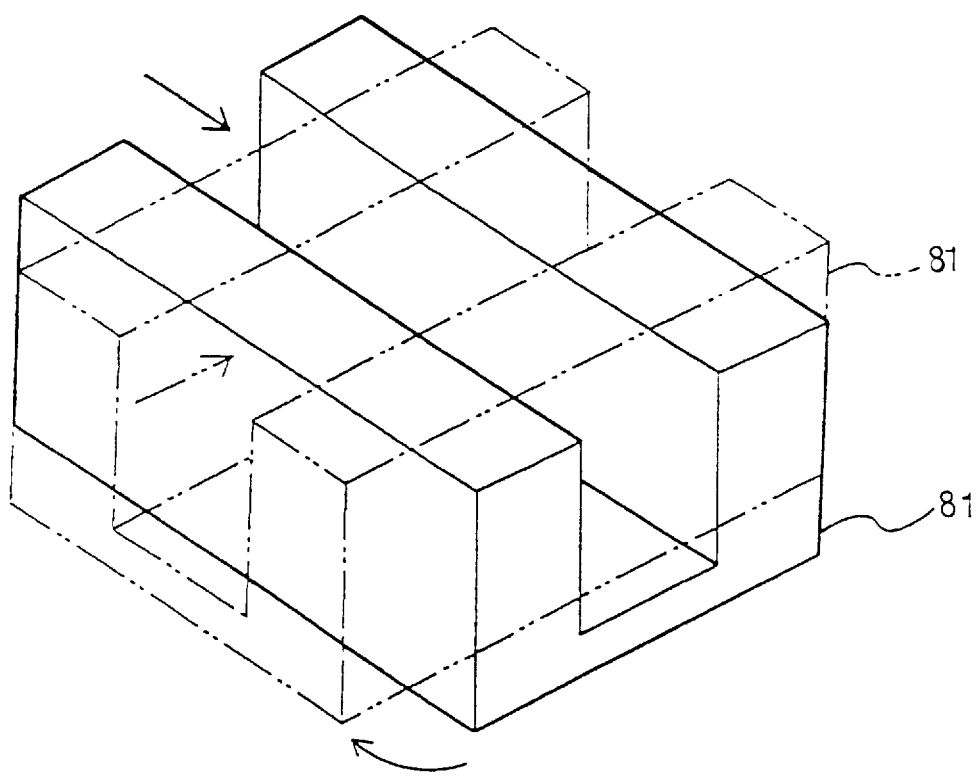
FIG. 21 is a perspective view of a rotating operation of a detecting portion of the electronic parts loading device according to the third embodiment of the present invention.

As shown in FIG. 18b, a center position calculated by the movement reflects a value of Y axis. As a center axis C of the spreading portion 25 is calculated by performing the above preferred embodiment according to FIG. 18b (S28), X and Y are confirmed by a calculation data having 90 degrees of rotation difference. Also, FIG. 18c shows that a position data reflecting the eccentricity r of the center axis and phase θ is finally calculated (S29).

If a center axis C of the spreading portion 25 is not calculated (S28), a center point of the needle is calculated by rotating at two times the spreading portion 25 90 degrees (Referring to FIG. 19a–FIG. 19d). Accordingly, a center axis C of the needle 26 is calculated from a crossing point calculated by connecting each center position opposed in the center position of the needle accordance with the 4 shifting directions as shown in FIG. 19e, and an eccentricity r of the center axis C and phase θ are calculated (S30).

As shown in FIG. 15, a center of the needle 26 is adjusted at the beam L of the photoelectric switch (S31), and the spreading portion 25 ascends by actuating the electric motor 61 (S32). By means of the above method, as the beam L blocked by the needle 26 is then transmitted to the light receiving portion 84, the point p of the needle 26 is calculated from the mutual relation with the encoder pulse of the electric motor 61 (S33). If a length of the needle of the exchanged syringe 44 is identical to the length of the former needle, a calculation process of the point p of the needle 26 may be omitted.

After an eccentricity r, phase θ, and point p of the needle 26 are calculated, a motion program of the electric motor 7, 16 and 61 stored in RAM 86 by control part 85, namely data of X, Y, and Z axis which operate the spreading portion 25, can be corrected (S34).

Consequently, the control part 85 causes the spreading portion 25 to descend downward by actuating the electric motor 7 and 16. After the descent movement, pressed air is supplied to the pulse from the pressure source in the syringe 44, and a fixed amount of the adhesive material is applied on the surface of the PCB 20 (S35). At this time, as the operation of the electric motor 7, 16 and 61 is controlled by the position data of the position calculation portion 80 so that the point p of the needle 26 is adjusted with accuracy, the adhesive material can be loaded at the spreading position. Moreover, after finishing spreading the adhesive material, the needle 26 moves to an upper, ascending limit by actuating the electric motor 61.

Although some electronic parts W are returned and fixed to the portion deposited with the solder, a position data of the suction bits 27 can be calculated in the loading head 24 carrying out the identical procedure as was carried out for the needle 26, and the point of the suction bits 27 can get their exact position with accuracy.

Figure 17A:
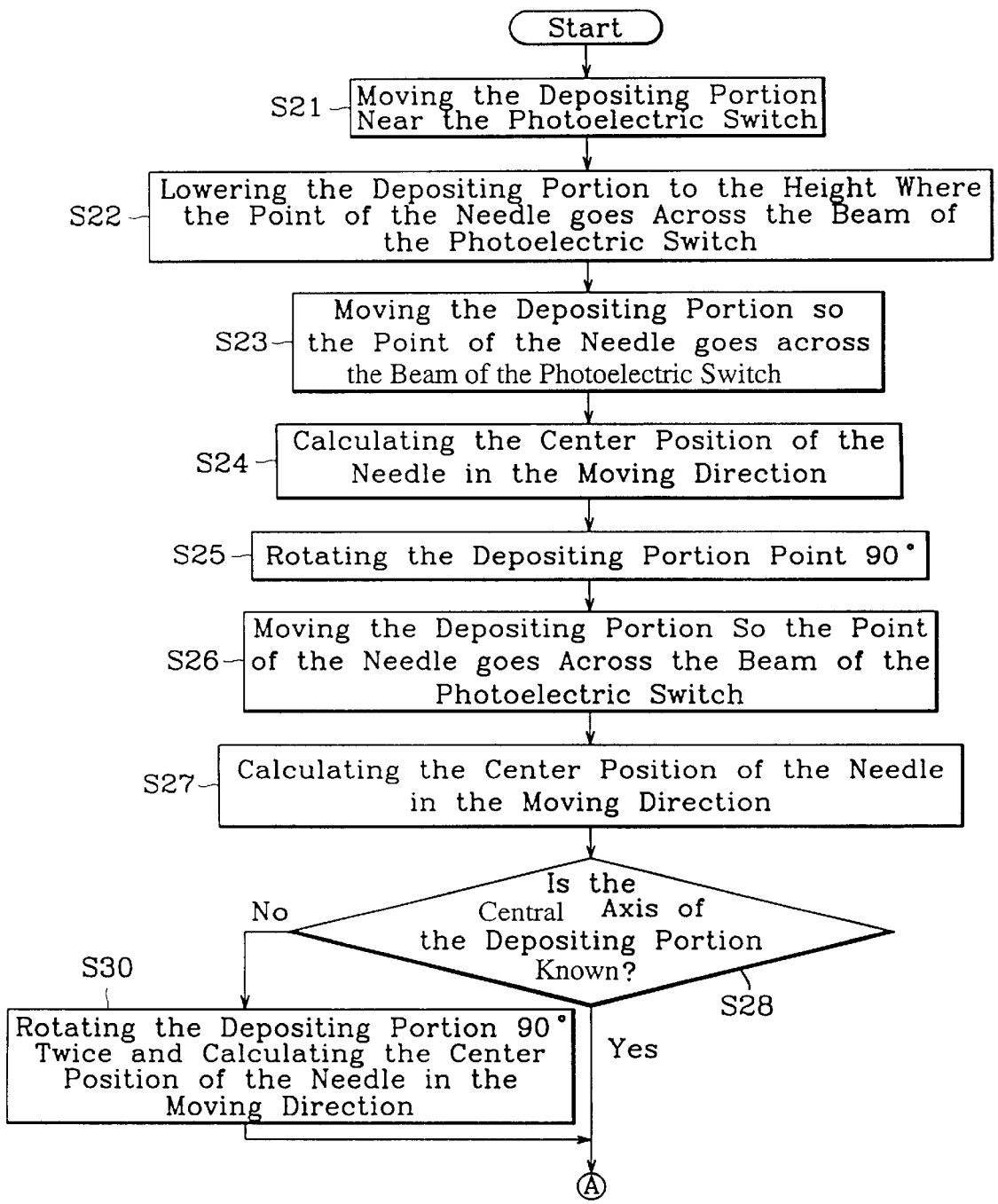
FIGS. 17A and 17B are flow charts of a cream solder application process performed by the electronic parts loading device according to the third embodiment of the present invention.
Figure 17B:
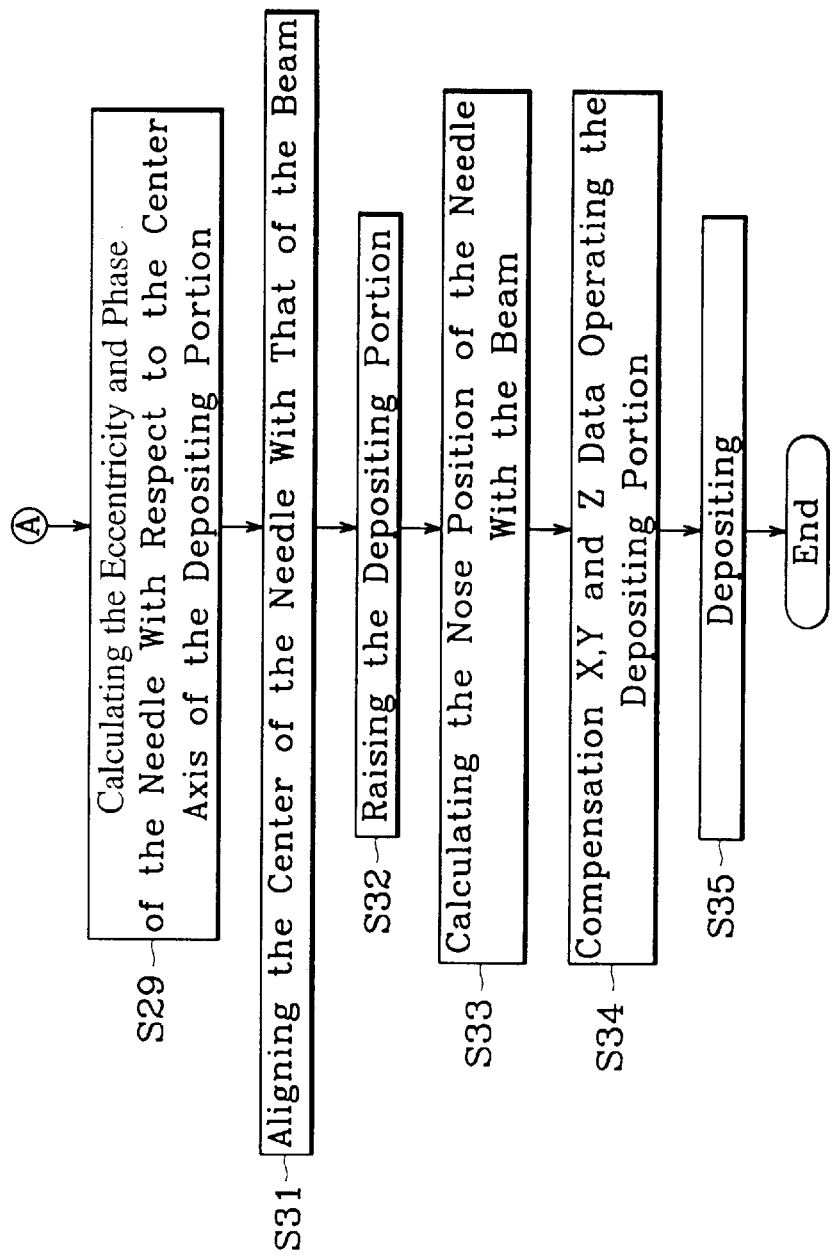

As a result, in accordance with the process shown in FIG. 17, the loading head 24 is moved near the photoelectric switch and descends and moves horizontally for the point of the suction bit 27 to go across the beam L thereby calculating the center position of moving direction of the suction bit 27. Further, the loading head 24 is rotated around the central axis by 90 degrees, thereby obtaining the center position of the moving direction and calculating the position data of the phase θ and eccentricity r with respect to the central axis C.

Then, the loading head 24 is ascended in a state aligning the center of the suction bit 27 and that of the beam L, thereby calculating the point position of the loading head 24.

In the control portion 85, in accordance with the obtained eccentricity r, phase θ, and point position p, the data of X, Y and Z axes direction for operating the loading head 24 is compensated. The loading head 24 of the suction bit side, for positioning the head unit 6 in any place of parts stage 23 shown in FIG. 11, picks up an electronic part W retained in a parts stage 23, sends and releases it to the solder position, and attaches it to the PCB 20.

As described above, since the point of the suction bit 27 is positioned with high accuracy during loading the parts, the electronic parts W are accurately attached in the loading position.

Further, in case of loading the electronic parts having leads corresponding to the socket of the PCB and not using the solder and adhesive materials, loading process is achieved by the suction bit 27 without operating the spreading portion 25.

In this embodiment, the spreading portion 25 includes two needles 26a and 26b and positioning is achieved as in shown FIG. 20.

Initial movement is accomplished in the direction of moving perpendicular to the line connecting the two needles 26a and 26b (see FIG. 20). Therefore, common x-coordinate between two needles 26a and 26b is obtained. As in the flow chart shown in FIG. 17, two needles 26a and 26b are folded each other when the spreading portion 25 goes across the beam L before it moves to calculate initial center position (S23), and the driving motor 54 is driven as in minimizing the external width thereby rotating the spreading portion.

Then, the spreading portion 25 is horizontally rotated for the points of the needles 26a and 26b to go across the beam L of the photoelectric switch by rotating the spreading portion 25 around the central axis 90 degrees. As shown in FIG. 20, by this movement, Y- coordinate corresponding to each needle 26a and 26b is obtained, and the eccentricity r1 and phase θ 1 of the needle 26a and the eccentricity r2 and phase θ 2 of the needle 26b are calculated by X, Y1 and X, Y2 (see FIG. 20).

Although preferred embodiments of the present invention have been described in detail hereinabove, it should be clearly understood that many variations and/or modifications of the basic inventive concepts herein taught will still fall within the spirit and scope of the present invention.

For example, the measuring portion 70 in accordance with the first and second embodiments of the present invention uses a laser displacement meter, but it will be possible to use a supersonic wave displacement meter. Further, it will be possible to use contacting type of a displacement meter employing a stylus in the measuring position.

In a stylus-type displacement meter, the styluses are mounted on the spreading portion, loading head, and a movable portion and the contacting position between the point of the stylus and the surface of the PCB is detected by the encoder of the driving motor 61 thereby measuring the distance from the detecting value.

The spreading portion 25 moves in a X-axis direction with respect to the crossbar 5 which moves in Y-axis direction along the horizontal supporting members 1 and 2 so that it positions in any place on the plane. However, it will be possible to mount the spreading portion in the guide member to be linearly moved.

The number of the loading heads 24 mounted on the head unit 6 is not restricted to two.

Further, in the third embodiment of the present invention, positioning of working rod bodies, such as the needles 26, 26a and 26b and the suction bit 27, is accomplished by rotating the working means, such as the spreading portion 25 and loading head 24 around the central axis 90 degrees and simultaneously moving the working means. However, it will be possible to rotate the detecting portion 81 for detecting placement or moving the detecting portion 81. That is, the working means can relatively rotate around the central axis or relatively move.

The moving center with respect to the head unit 6 can differ from the real center of the loading head 24 and the spreading portion 25 according to a device. As the same processes of picking up the electronic part W in the suction bit 27 and positioning the needle 26 by passing the electronic part W through the beam L, the position data of the eccentricity and phase is obtained, and the difference therebetween is calculated. Then, compensating the control part 85 to deny the difference, the two centers coincide with each other thereby obtaining a fine reaching and loading accuracy.

In this embodiment, although the spreading portion 25 moves in an X axis direction with respect to the crossbar 5 which moves in a Y axis direction along the horizontal supporting members 1 and 2 and moves in any place of the plane, it will be possible to mount the spreading portion 25 in the guiding member to be linearly moved.

The number of the loading heads 24 mounting on the head unit 6 is not restricted to two.

As described above, since distance to the part loading position is measured and calculated in accordance with the first and second embodiments of the present invention and an amount of driving of the upper and lower driving elements is controlled thereby, descending of the working element with respect to the PCB is precisely controlled thereby preventing over and under descending. Therefore, it is possible to stably load the parts.

If the electronic parts loading device is structured such that the distance from the curved PCB to the parts loading position can be calculated, it does not need to measure the distance for every loading job and it will be possible to reduce time for working.

Further, since the eccentricity, phase, and point position of working rod bodies are calculated according to the third embodiment of the present invention and the operation of the driving element is controlled thereby, the point of the working rod bodies can be precisely positioned. Accordingly, without using the retaining element for positioning center, it will be possible to improve the loading quality of the electronic parts loading device. In addition, since it does not need to use the retaining element, the structure of the device can be simple, and the need to change the retaining element eliminated.

What is claimed is:

1. An electronic part mounting device, comprising:
   a head unit for loading an operation means for performing an operation on a printed circuit board;
   driving means for moving the operation means toward or away from the printed circuit board;
   storage means for storing a standard distance value;
   measuring means, mounted on a fixed portion of the head unit, for measuring a distance from the head unit to a predetermined loading position on the printed circuit board using one of ultrasonic and optical means without contacting the printed circuit board;
   comparison means for comparing the measured distance to the stored standard distance value and generating a comparison result; and
   control means for optimally controlling a vertical movement of the operation means in response to the comparison result generated by the comparison means whenever the operation means performs the operation.

2. An electronic part mounting device according to claim 1, further comprising:
   contact measuring means, mounted on a movable portion of the head unit, for measuring a distance from the head unit to a predetermined loading position on the printed circuit board using one of a probe and a needle contacting the printed circuit board.

3. An electronic part mounting device according to claim 1, wherein said operation means includes
   loading means for loading electronic parts on the printed circuit board.

4. An electronic part mounting device according to claim 1, wherein said operation means includes
   spreading means for spreading adhesive at a predetermined position on the printed circuit board.

5. An electronic part mounting device according to claim 1, wherein the control means includes
   means for determining a curvature state of the printed circuit board in response to the measured distance before the operation means starts the operation,
   means for calculating a distance of a part loading position from the determined curvature state and a driving amount of the driving means while the operation means performs the operation, and means for optimizing a vertical movement of the operation means.

6. An electronic part mounting device, comprising:

a head unit for loading an operation means for performing an operation on a printed circuit board;

driving means for moving the operation means toward or away from the printed circuit board;

measuring means, mounted on the head unit, for measuring a distance from the head unit to a predetermined loading position on the printed circuit board; and control means for determining a curvature state of the printed circuit board in response to the measured distance before the operation means starts the operation, for calculating a distance of a part loading position from the determined curvature state and a driving amount of the driving means while the operation means performs the operation, and for optimizing a vertical movement of the operation means.

7. An electronic part mounting device according to claim 6, wherein the measuring means comprises:

contact measuring means, mounted on a movable portion of the head unit, for measuring a distance using one of a probe and a needle contacting the printed circuit board.

8. An electronic part mounting device according to claim 6, wherein the measuring means comprises:

non-contact measuring means, mounted on a fixed portion of the head unit, for measuring a distance using one of ultrasonic and optical means without contacting the printed circuit board.

9. An electronic part mounting device according to claim 6, wherein said operation means includes loading means for loading electronic parts on the printed circuit board.

10. An electronic part mounting device according to claim 6, wherein said operation means includes spreading means for spreading adhesive at a predetermined position on the printed circuit board.

\* \* \* \* \*